(12) United States Patent
Liu et al.

(10) Patent No.: US 10,299,340 B2
(45) Date of Patent: May 21, 2019

(54) LIGHT-BAR STRUCTURE

(71) Applicants: AU Optronics (Suzhou) Corp., Ltd., Suzhou (CN); AU Optronics Corporation, Hsin-chu (TW)

(72) Inventors: Qiong Liu, Suzhou (CN); Guang-Dong Wei, Suzhou (CN)

(73) Assignees: AU OPTRONICS (SUZHOU) CORP., LTD., Suzhou (CN); AU OPTRONICS CORPORATION, Hsin-Chu (TW)

( * ) Notice: Subject to any disclaimer, the term of this patent is extended or adjusted under 35 U.S.C. 154(b) by 56 days.

(21) Appl. No.: 15/472,366

(22) Filed: Mar. 29, 2017

(65) Prior Publication Data
US 2018/0063904 A1    Mar. 1, 2018

(30) Foreign Application Priority Data
Aug. 31, 2016   (CN) .......................... 2016 1 0792613

(51) Int. Cl.
| | | |
|---|---|---|
| H05B 33/08 | (2006.01) | |
| H01L 27/02 | (2006.01) | |
| H01L 49/02 | (2006.01) | |
| H01L 25/075 | (2006.01) | |
| H01L 33/62 | (2010.01) | |

(52) U.S. Cl.
CPC ....... *H05B 33/089* (2013.01); *H01L 25/0753* (2013.01); *H01L 27/0248* (2013.01); *H01L 28/40* (2013.01); *H01L 33/62* (2013.01)

(58) Field of Classification Search
CPC .......................... H05B 33/089; H01L 27/0248
See application file for complete search history.

(56) References Cited

U.S. PATENT DOCUMENTS

| | | | |
|---|---|---|---|
| 7,154,149 B2 | 12/2006 | Wu et al. | |
| 8,576,355 B2 | 11/2013 | Hosoki | |
| 2012/0147625 A1* | 6/2012 | Yang | .................... G02B 6/0085 362/612 |
| 2016/0276293 A1* | 9/2016 | Hung | .................. H01L 27/0248 |

FOREIGN PATENT DOCUMENTS

WO    WO2013149411 A1    10/2013

* cited by examiner

*Primary Examiner* — Jamie C Niesz
(74) *Attorney, Agent, or Firm* — WPAT, PC

(57) ABSTRACT

A light-bar structure includes a first substrate, a second substrate, and an insulation layer. The first substrate includes a first anode region and a plurality of element regions. Each of the element regions is configured to allow a light-emitting element to be disposed on. At least one of the element regions includes an anode portion and a node portion. The anode portion is connected to the first anode region. The second substrate includes a grounding region and a second anode region. The anode portion is disposed correspondingly to the grounding region. The node portion is disposed correspondingly to the second anode region. The insulation layer is disposed between the first substrate and the second substrate.

4 Claims, 13 Drawing Sheets

LIGHT-BAR STRUCTURE

BACKGROUND

Technical Field

This disclosure relates to a light emitting technology, and in particular, to a light-bar structure.

Related Art

In recent years, with the development and popularization of display technologies, display apparatuses have been applied to varies types of electronic apparatuses, for example, personal desktop computers, tablet computers, notebook computers, or other portable electronic apparatuses.

Using a notebook computer as an example, a display apparatus of the notebook computer includes a back light unit (BLU). The BLU includes a light-bar. However, in a process of assembling the notebook computer, in order to confirm the brightness of the BLU at any time, the light-bar needs to be maintained in a lit state. In this case, a light-emitting element on the light-bar is likely to be damaged by electrostatic discharge (ESD).

Therefore, how to improve resistance of a light-bar structure to ESD has become one of urgent problems in the prior art.

SUMMARY

In view of that, the context of this disclosure provides a light-bar structure, so as to resolve the aforementioned problem in the prior art.

An embodiment of this disclosure relates to a light-bar structure. The light-bar structure comprises a first substrate, a second substrate, and an insulation layer. The first substrate comprises a first anode region and a plurality of element regions. Each of the element regions is configured to allow a light-emitting element to be disposed on. At least one of the element regions comprises an anode portion and a node portion. The anode portion is connected to the first anode region. The second substrate comprises a grounding region and a second anode region. The anode portion is disposed correspondingly to the grounding region. The node portion is disposed correspondingly to the second anode region. The insulation layer is disposed between the first substrate and the second substrate.

An embodiment of this disclosure relates to a light-bar structure. The light-bar structure comprises a first substrate, a second substrate, and an insulation layer. The first substrate comprises a first anode region and a plurality of element regions. Each of the element regions is configured to allow a light-emitting element to be disposed on. At least one of the element regions comprises an anode portion and a node portion. The first anode region is electrically connected to the anode portion to form an anode of the first substrate. The second substrate comprises a grounding region and a second anode region. A first capacitor is formed between the anode of the first substrate and the grounding region. A second capacitor is formed between the second anode region and a ground terminal. A third capacitor is formed between the node portion and the second anode region. The insulation layer is disposed between the first substrate and the second substrate.

An embodiment of this disclosure relates to a light-bar structure. The light-bar structure comprises a first substrate, a second substrate, and an insulation layer. The first substrate comprises a plurality of element regions. Each of the element regions is configured to allow a light-emitting element to be disposed on. Each of the element regions comprises a node portion. The second substrate comprises a grounding region and an anode region. The grounding region is disposed correspondingly to the node portions. Corresponding areas between the grounding region and the node portions are in ascending order along a direction. The anode region is disposed correspondingly to the node portions. Corresponding areas between the anode region and the node portions are in descending order along the direction. The insulation layer is disposed between the first substrate and the second substrate.

Based on the above, by means of application of one of the foregoing embodiments, resistance of a light-bar structure to ESD can be improved.

BRIEF DESCRIPTION OF THE DRAWINGS

To make the foregoing and other objectives, features, advantages, and embodiments of this disclosure more comprehensible, accompanying drawings are described as follows.

DETAILED DESCRIPTION

The following describes the embodiments in detail with reference to the accompanying drawings. However, the provided embodiments are not intended to limit the scope of this disclosure, and the description of the operation of a structure is not intended to limit an execution sequence. Any apparatus with equivalent functions that is produced from a structure formed by a recombination of elements shall fall within the scope of this disclosure. In addition, the drawings are intended for description only, and are not drawn according to original dimensions. To facilitate comprehension, same elements or like elements in the description below are described by using a same reference sign.

The terms used in this specification and the claims generally have their ordinary meanings in the art, in the context of this disclosure, and in specific contexts unless the terms are additionally annotated.

The terms such as "first", "second" and "third" used in this specification are not intended to indicate sequences or orders and are not intended to limit this disclosure, and are merely intended to distinguish between elements or operations described by using a same technical term.

Figure 1A:
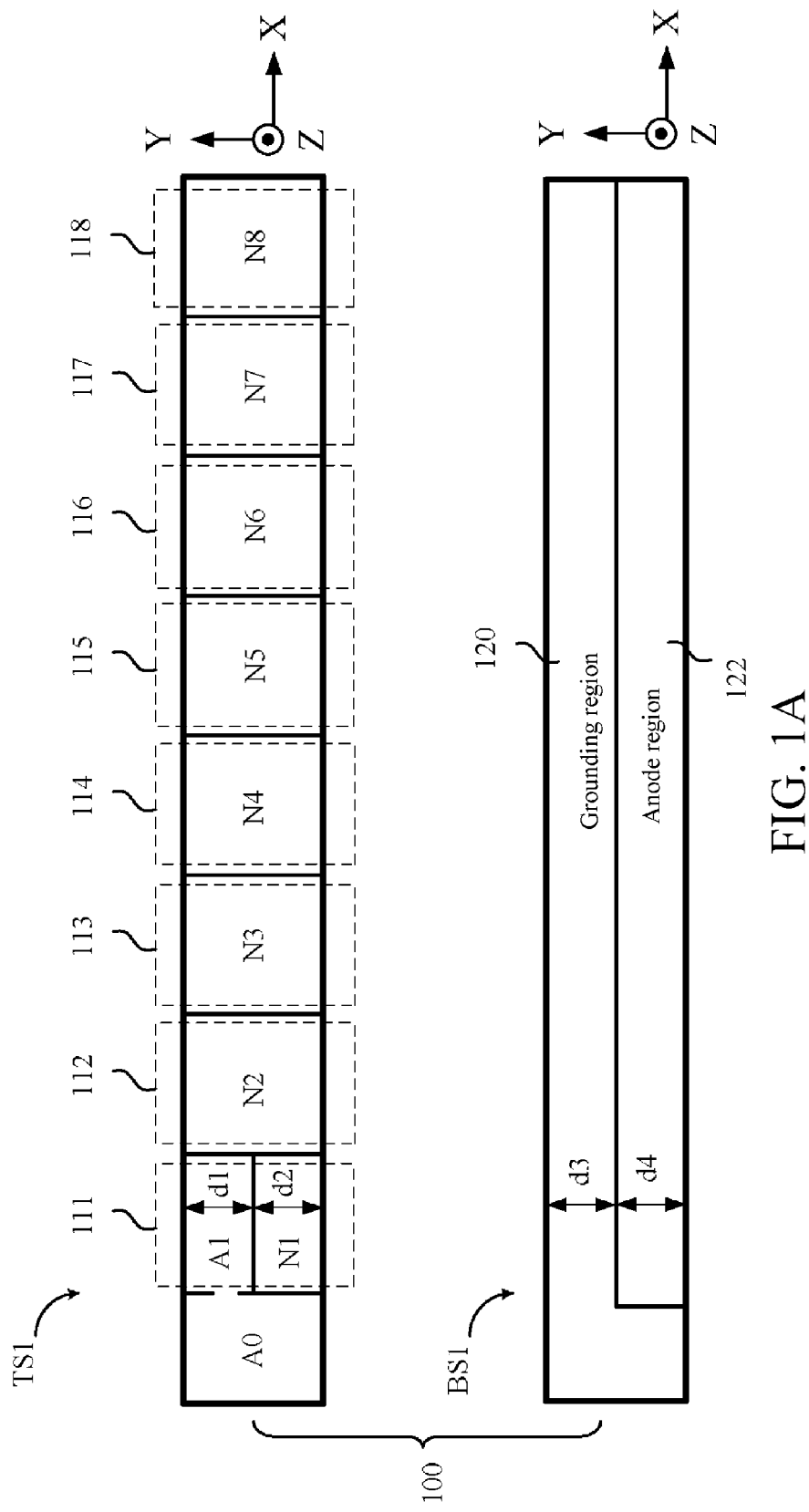
FIG. 1A is a schematic diagram of a light-bar structure according to some embodiments of this disclosure.
Figure 1B:
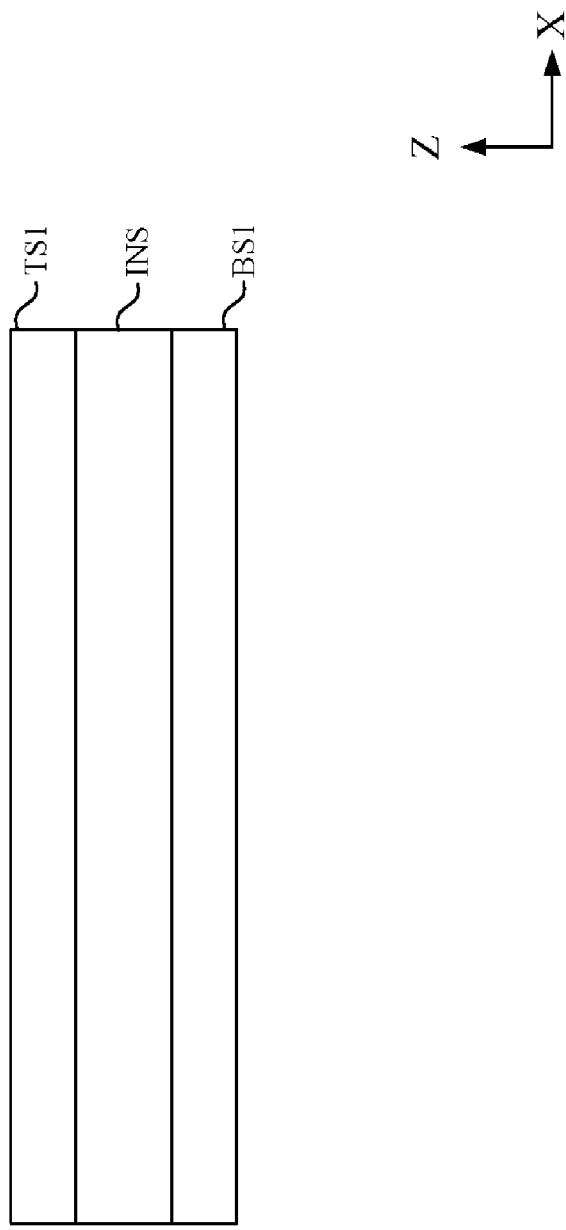
FIG. 1B is a side view of the light-bar structure according to FIG. 1A.

Referring to FIG. 1A and FIG. 1B, FIG. 1A is a schematic diagram of a light-bar structure 100 according to some embodiments of this disclosure, and FIG. 1B is a side view of the light-bar structure 100 according to FIG. 1A. The light-bar structure 100 includes a first substrate TS1, a second substrate BS1, and an insulation layer INS. To simplify the content of the drawing, FIG. 1A omits the insulation layer INS. The first substrate TS1 is disposed correspondingly to the second substrate BS1. In some embodiments, the first substrate TS1 is an upper substrate, and the second substrate BS1 is a lower substrate. The insulation layer INS is disposed between the first substrate TS1 and the second substrate BS1. In another embodiment, a spatial relative relationship between the first substrate TS1 and the second substrate BS1 is not limited to that shown in FIG. 1A.

Using FIG. 1A as an example, the first substrate TS1 includes an anode region A0 and a plurality of element regions 111-118. The first substrate TS1 is sequentially provided with the anode region A0 and the element regions 111-118 along a direction X. Each of the element regions 111-118 is configured to allow a light-emitting element to be disposed on. In other words, the light-bar structure 100 may allow eight light-emitting elements to be disposed on, thereby forming the light-bar. The number is merely used as an example, and this disclosure is not limited to the number. The light-emitting elements may be light emitting diodes (LEDs), but this disclosure is not limited thereto. When the light-bar structure 100 is lit, a current flows from the anode region A0 to the light-bar structure 100, and subsequently, the current passes the element regions 111-118, and flows out from a cathode (not shown) at a rear end, thereby lighting the light-emitting elements on the element regions 111-118.

The element region 111 is segmented into an anode portion A1 and a node portion N1 along a direction Y. The direction Y is perpendicular to the direction X. The anode portion A1 is connected to the anode region A0. In other words, the anode region A0 is electrically connected to the anode portion A1. The anode region A0 and the anode portion A1 together form an anode of the first substrate TS1. The node portion N1 is configured to allow a light-emitting element to be disposed on. The element regions 112-118 are respectively provided with node portions N2-N8. Each of the node portions N2-N8 is configured to allow a light-emitting element to be disposed on.

A portion of the second substrate BS1 is segmented into a grounding region 120 and an anode region 122 along the direction Y. As shown in FIG. 1A, a left portion of the second substrate BS1 is only provided with the grounding region 120, but the remaining portion is segmented into the grounding region 120 and the anode region 122 along the direction Y. In other words, the grounding region 120 is substantially L shaped.

A width d1 of the anode portion A1 is the same as a width d3 of the grounding region 120. That is, the anode portion A1 merely corresponds to the grounding region 120, and does not correspond to the anode region 122. A width of the node portion N1 is the same as a width d4 of the anode region 122. That is, the node portion N1 merely corresponds to the anode region 122, and does not correspond to the grounding region 120.

In short, the anode region A0 and the anode portion A1 correspond to the grounding region 120. The node portion N1 corresponds to the anode region 122. Upper half portions of the node portions N2-N8 correspond to the grounding region 120, and lower half portions of the node portions N2-N8 correspond to the anode region 122.

"Correspond" refers to that two elements are at least partially aligned in a direction Z, or refers to any configuration manner that can form a capacitor. Besides, the "upper half part" or the "lower half part" uses a direction in the figure as an example, but is not intended to limit this disclosure.

Figure 1C:
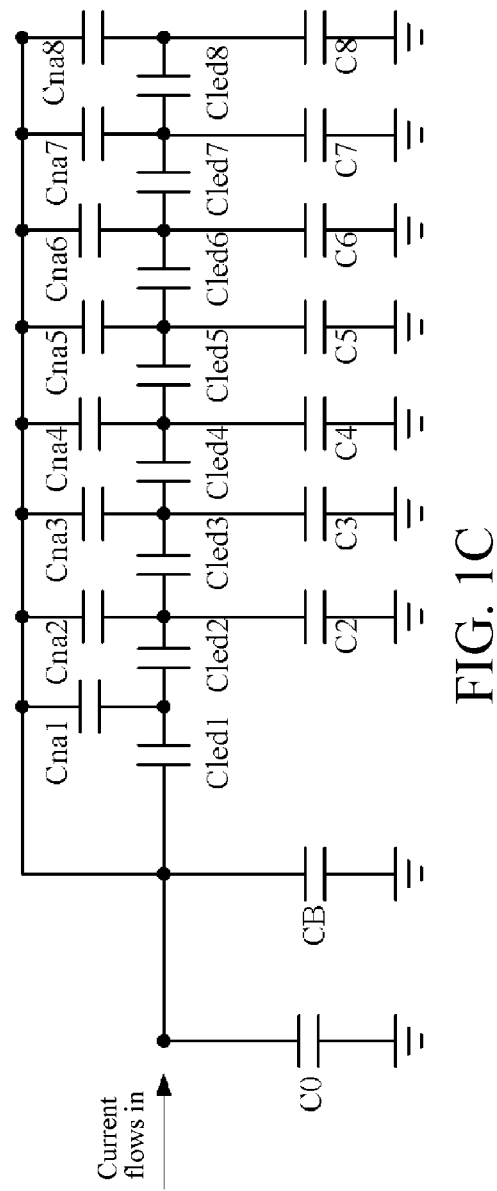
FIG. 1C is an equivalent circuit diagram of the light-bar structure according to FIG. 1A.

Subsequently, refer to FIG. 1A and FIG. 1C at the same time. FIG. 1C is an equivalent circuit diagram of the light-bar structure 100 according to FIG. 1A. A first capacitor C0 is formed between the anode of the first substrate TS1 (the anode region A0 and the anode portion A1) and the grounding region 120. A second capacitor CB is formed between the anode region 122 and a ground terminal (or an iron piece for grounding). Because the anode region A0 is electrically connected to the anode region 122, a first terminal of the first capacitor C0 is electrically connected to a first terminal of the second capacitor CB. A second terminal of the first capacitor C0 and a second terminal the second capacitor CB are electrically connected to the ground terminal. A third capacitor Cna1 is formed between the node portion N1 and the anode region 122. Third capacitors Cna2-Cna8 are respectively formed between the lower half parts of the node portions N2-N8 and the anode region 122. Fourth capacitors C2-C8 are respectively formed between the upper half parts of the node portions N2-N8 and the grounding region 120. Moreover, capacitors of the eight light-emitting elements are capacitors Cled1-Cled8. A coupling relationship between the foregoing capacitors is as shown in FIG. 1C.

In the light-bar structure 100, the anode portion A1 in the element region 111 and the anode region A0 together form the anode of the first substrate TS1, thereby enlarging an area of the anode of the first substrate TS1. In this way, a capacitance of the capacitor C0 between the anode of the first substrate TS1 and the grounding area 120 can be increased. The capacitor C0 can be used to store more electric charges, thereby reducing the quantity of electricity that passes the subsequent light-emitting elements (that is, the capacitors Cled1-Cled8). In this case, the light-emitting elements can be protected, thereby further improving the resistance of the light-bar structure 100 to ESD.

In the light-bar structure 100, the second substrate BS1 is provided with the anode region 122, so that the capacitor CB is formed between the anode region 122 and the ground terminal (or an iron piece for grounding). The capacitor CB may be configured to store electric charges, thereby reducing the quantity of electricity that passes the capacitors Cled1-Cled8 of the light-emitting elements. In this way, the resistance of the light-bar structure 100 to ESD can be improved.

In the light-bar structure 100, the second substrate BS1 is provided with the anode region 122, so that the capacitors Cna1-Cna8 are respectively formed between the node portions N1-N8 and the anode region 122. The capacitors Cna1-Cna8 may be used to bypass a part of quantity of electricity, thereby reducing the quantity of electricity that passes the capacitors Cled1-Cled8 of the light-emitting elements. In this way, the resistance of the light-bar structure 100 to ESD can be improved.

In the light-bar structure 100, the second substrate BS1 is provided with the anode region 122, and an area of the grounding area 120 is correspondingly decreased. In this case, corresponding areas between the node portions N2-N8 and the grounding region 120 are decreased in the direction Z, thereby decreasing the capacitances of the capacitors C2-C8. When the capacitances of the capacitors C2-C8 are decreased, the quantity of electricity that passes the capacitors Cled2-Cled8 of the light-emitting elements can be reduced, thereby further improving the resistance of the light-bar structure 100 to ESD.

In addition, using the light-bar structure 100 as an example, the light-emitting element disposed at the node portion N2 bears a largest voltage. This light-emitting element is most likely to be damaged by ESD. By means of an increase in the capacitance of the capacitor C0, the capacitance of the capacitor C0 is greater than the capacitance of the capacitor Cled2 of this light-emitting element, which can improve the resistance of the light-bar structure 100 to ESD. A greater ratio of the capacitance of the capacitor CO to the capacitance of the capacitor Cled2 results in better improvement of the resistance of the light-bar structure 100 to ESD.

Figure 2A:
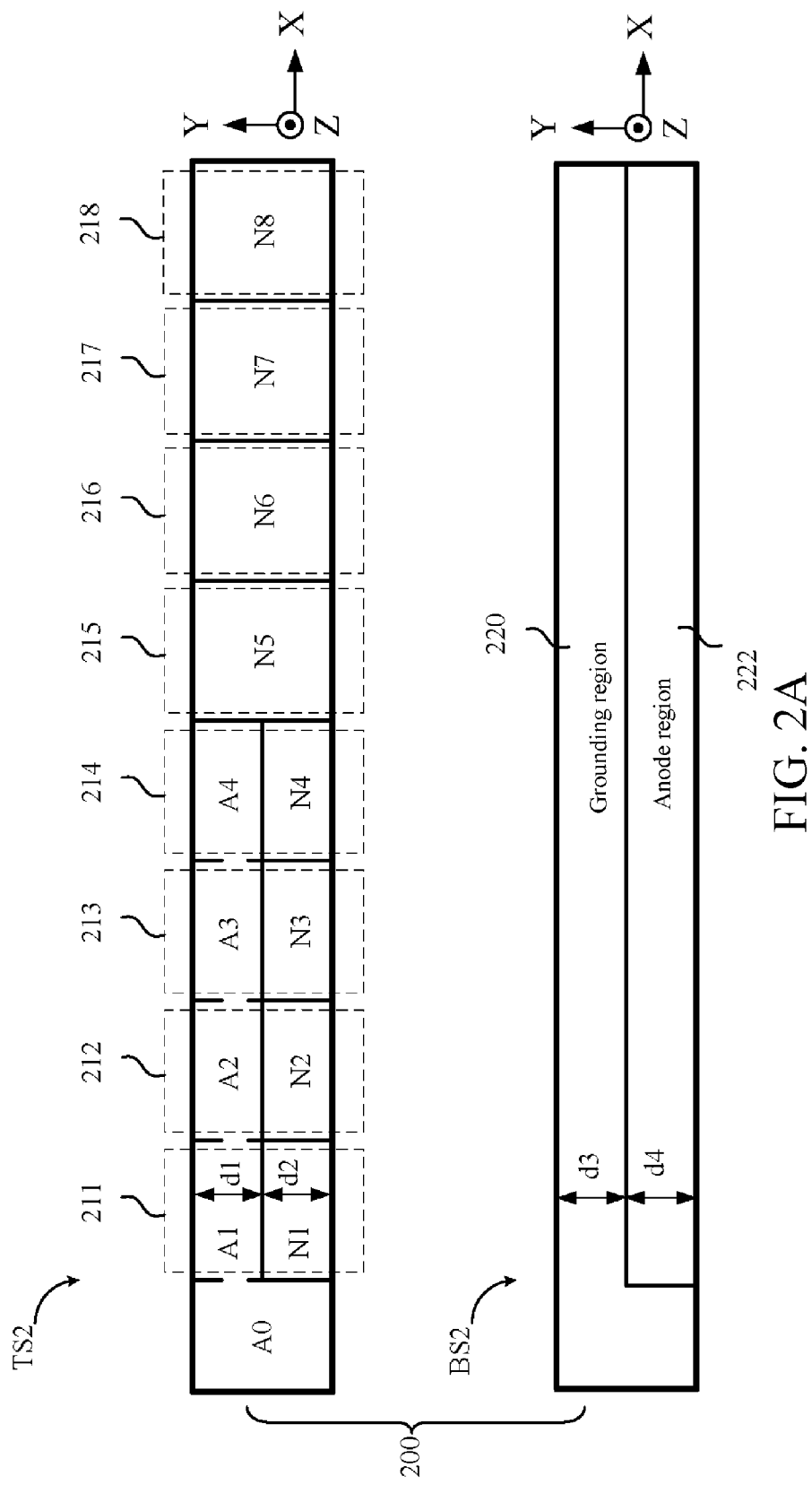
FIG. 2A is a schematic diagram of a light-bar structure according to some embodiments of this disclosure.

Referring to FIG. 2A, FIG. 2A is a schematic diagram of a light-bar structure 200 according to some embodiments of this disclosure. The light-bar structure 200 is similar to the light-bar structure 100. The light-bar structure 200 includes a first substrate TS2, a second substrate BS2, and an insulation layer (not shown).

The first substrate TS2 includes an anode region A0 and a plurality of element regions 211-218. Specifically, the first substrate TS2 is sequentially provided with the anode region A0 and the element regions 211-118 along a direction X.

The element region 211 is segmented into an anode portion A1 and a node portion N1 along a direction Y. The element region 212 is segmented into an anode portion A2 and a node portion N2 along the direction Y. The element region 213 is segmented into an anode portion A3 and a node portion N3 along the direction Y. The element region 214 is segmented into an anode portion A4 and a node portion N4 along the direction Y. The element regions 215-118 are respectively provided with node portions N5-N8. Each of the node portions N1-N8 is configured to allow a light-emitting element to be disposed on.

The anode region A0 and the anode portions A1-A4 are connected in series along the direction X. In other words, the anode region A0 is electrically connected to the anode portions A1-A4. The anode region A0 and the anode portions A1-A4 together form an anode of the first substrate TS2. The second substrate BS2 in FIG. 2A is similar to the second substrate BS1 in FIG. 1A, and therefore, details are not described herein again.

A width d1 of each of the anode portions A1-A4 is the same as a width d3 of a grounding region 220. That is, the anode portions A1-A4 merely correspond to the grounding region 220, and do not correspond to an anode region 222. A width d2 of each of the node portions N1-N4 is the same as a width d4 of the anode region 222. That is, the node portions N1-N4 merely correspond to the anode region 222, and do not correspond to the grounding region 220. In short, the anode region A0 and the anode portions A1-A4 correspond to the grounding region 220. The node portions N1-N4 correspond to the anode region 222. Upper half portions of the node portions N5-N8 correspond to the grounding region 220, and lower half portions of the node portions N5-N8 correspond to the anode region 222.

Figure 2B:
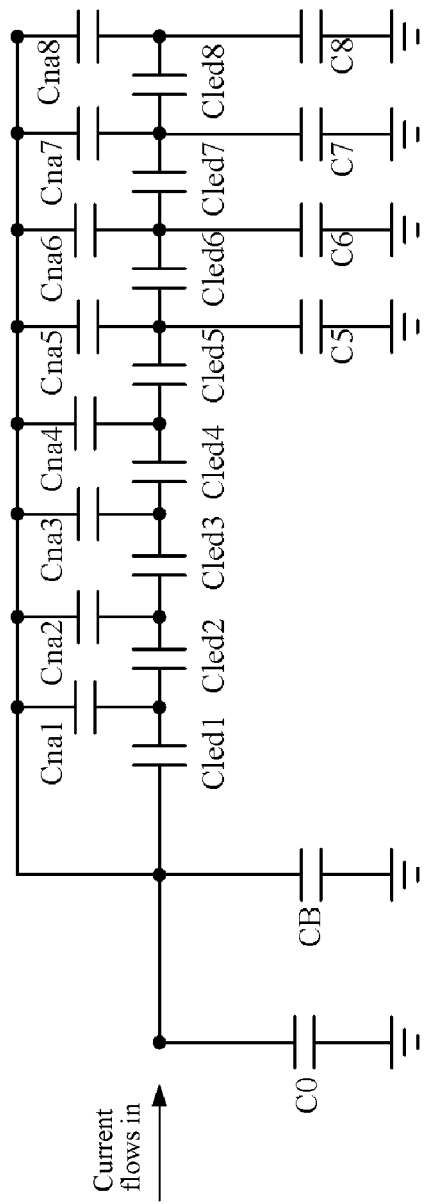
FIG. 2B is an equivalent circuit diagram of the light-bar structure according to FIG. 2A.

Subsequently, refer to FIG. 2A and FIG. 2B at the same time. FIG. 2B is an equivalent circuit diagram of the light-bar structure 200 according to FIG. 2A. A first capacitor C0 is formed between the anode of the first substrate TS2 (the anode region A0 and the anode portions A1-A4) and the grounding region 220. A second capacitor CB is formed between the anode region 222 and a ground terminal (or an iron piece for grounding). Third capacitors Cna1-Cna4 are respectively formed between the node portions N1-N4 and the anode region 222. Third capacitors Cna5-Cna8 are respectively formed between the lower half parts of the node portions N5-N8 and the anode region 222. Fourth capacitors C5-C8 are formed between the upper half parts of the node portions N5-N8 and the grounding region 220. Moreover, capacitors of the eight light-emitting elements are capacitors Cled1-Cled8. A coupling relationship between the foregoing capacitors is as shown in FIG. 2B.

As compared with the light-bar structure 100, in the light-bar structure 200, the first substrate TS2 is further provided with the anode portions A2-A4, so that an area of the anode of the first substrate TS2 is greater than an area of the anode of the first substrate TS1. In other words, a capacitance of the capacitor C0 between the anode of the first substrate TS2 and the grounding region 220 is greater than a capacitance of the capacitor C0 of the light-bar structure 100. In this case, the capacitor C0 of the light-bar structure 200 can be used to store more electric charges, thereby reducing the quantity of electricity passing the capacitors Cled1-Cled8 of the light-emitting elements. In this way, the resistance of the light-bar structure 200 to ESD can be improved.

As compared with the light-bar structure 100, in the light-bar structure 200, the grounding region 220 corresponds to the anode portions A2-A4, and does not correspond to the node portions N2-N4. Therefore, the light-bar structure 200 does not have capacitors C2-C4. In this case, the quantity of electricity passing the capacitors Cled2-Cled4 of the light-emitting elements is reduced, thereby improving the resistance of the light-bar structure 200 to ESD.

Figure 3A:
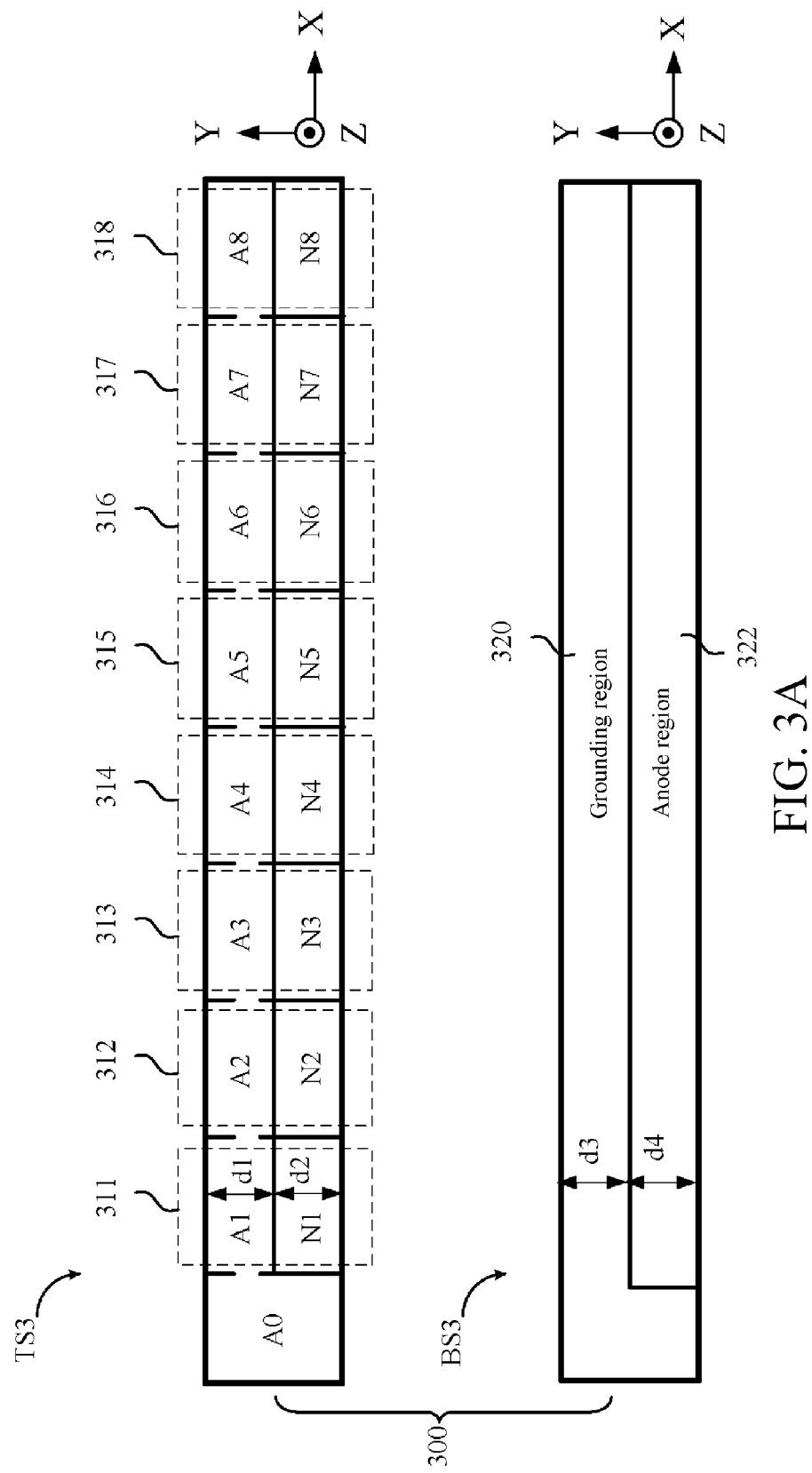
FIG. 3A is a schematic diagram of a light-bar structure according to some embodiments of this disclosure.

Referring to FIG. 3A, FIG. 3A is a schematic diagram of a light-bar structure 300 according to some embodiments of this disclosure. The light-bar structure 300 is similar to the light-bar structure 200. The light-bar structure 300 includes a first substrate TS3, a second substrate BS3, and an insulation layer (not shown).

The first substrate TS3 includes an anode region A0 and a plurality of element regions 311-318. Specifically, the first substrate TS3 is sequentially provided with the anode region A0 and the element regions 311-318 along a direction X.

All the element regions 311-318 of the first substrate TS3 are respectively segmented into anode portions A1-A8 and node portions N1-N8 along a direction Y. The anode region A0 and the anode portions A1-A8 are connected in series along the direction X. In other words, the anode region A0 is electrically connected to the anode portions A1-A8. The anode region A0 and the anode portions A1-A8 together form an anode of the first substrate TS3. The second substrate BS2 in FIG. 3A is similar to the second substrate BS1 in FIG. 1A, and therefore, details are not described herein again.

A width d1 of each of the anode portions A1-A8 is the same as a width d3 of the grounding region 320. That is, the anode portions A1-A8 merely correspond to the grounding region 320, and do not correspond to an anode region 322. A width d2 of each of the node portions N1-N8 is the same as a width d4 of the anode region 322. That is, the node portions N1-N8 merely correspond to the anode region 322, and does not correspond to the grounding region 320.

Figure 3B:
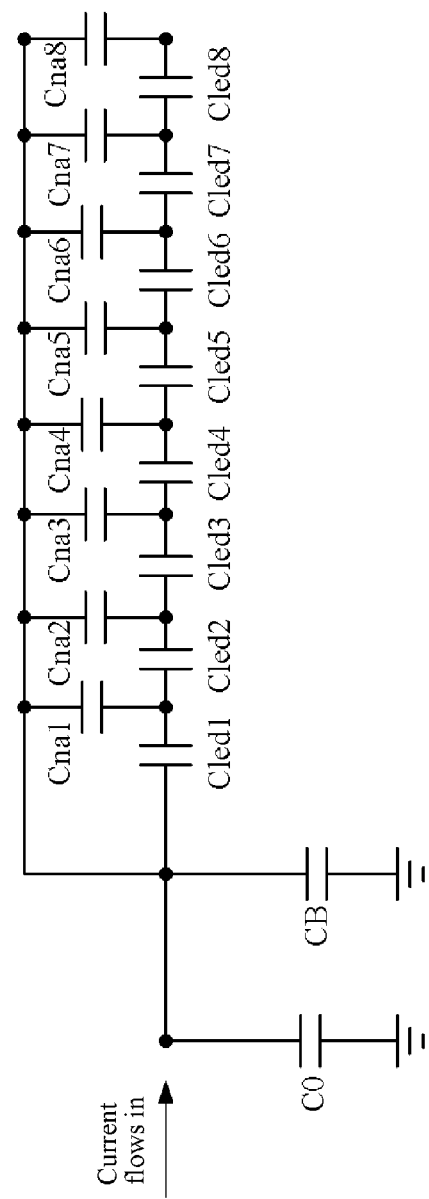
FIG. 3B is an equivalent circuit diagram of the light-bar structure according to FIG. 3A.

Subsequently, refer to FIG. 3A and FIG. 3B at the same time. FIG. 3B is an equivalent circuit diagram of the light-bar structure 300 according to FIG. 3A. A first capacitor C0 is formed between the anode of the first substrate TS3 (the anode region A0 and the anode portions A1-A8) and the grounding region 320. A second capacitor CB is formed between the anode region 322 and a ground terminal (or an iron piece for grounding). Third capacitors Cna1-Cna8 are respectively formed between the node portions N1-N8 and the anode region 322. Moreover, capacitors of the eight light-emitting elements are capacitors Cled1-Cled8. A coupling relationship between the foregoing capacitors is as shown in FIG. 3B.

As compared with the light-bar structure 200, in the light-bar structure 300, the first substrate TS3 is further provided with the anode portions A5-A8, so that an area of the anode of the first substrate TS3 is greater than an area of the anode of the first substrate TS2. In other words, a capacitance of the capacitor C0 between the anode of the first substrate TS3 and the grounding region 320 is greater than the capacitance of the capacitor C0 of the light-bar structure 200. In this case, the capacitor C0 of the light-bar structure 300 can be used to store more electric charges, thereby reducing the quantity of electricity passing the capacitors Cled1-Cled8 of the light-emitting elements. In this way, the resistance of the light-bar structure 300 to ESD can be improved.

As compared with the light-bar structure 100, in the light-bar structure 300, the grounding region 320 corresponds to the anode portions A2-A8, and does not correspond to the node portions N2-N8. Therefore, the light-bar structure 300 does not have capacitors C2-C8. In this case, the quantity of electricity passing the capacitors Cled2-Cled8 of the light-emitting elements is reduced, thereby improving the resistance of the light-bar structure 300 to ESD.

Figure 4A:
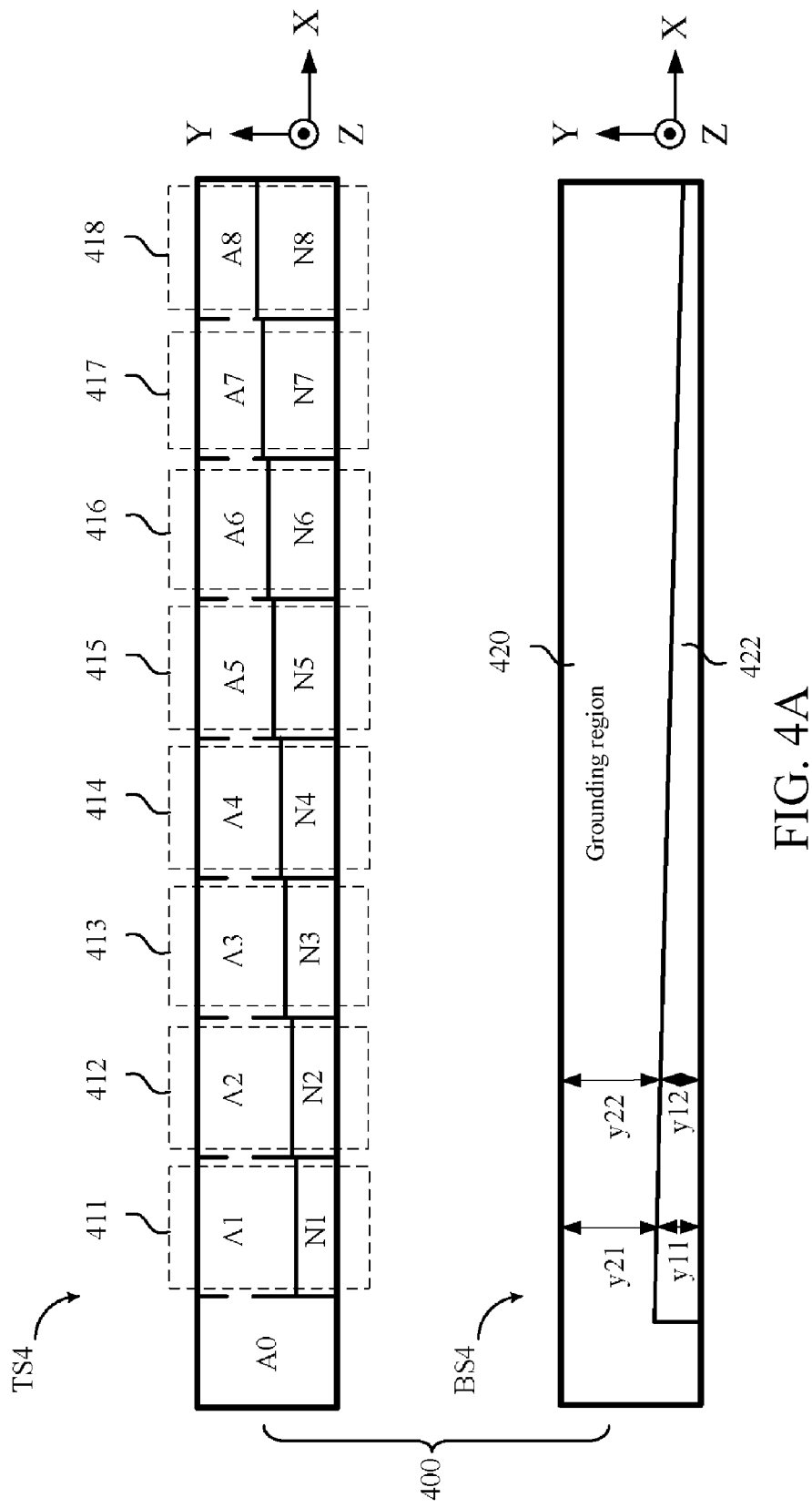
FIG. 4A is a schematic diagram of a light-bar structure according to some embodiments of this disclosure.

Referring to FIG. 4A, FIG. 4A is a schematic diagram of a light-bar structure 400 according to some embodiments of this disclosure. The light-bar structure 400 is similar to the light-bar structure 300. The light-bar structure 400 includes a first substrate TS4, a second substrate BS4, and an insulation layer (not shown).

The first substrate TS4 includes an anode region A0 and a plurality of element regions 411-418. Specifically, the first substrate TS4 is sequentially provided with the anode region A0 and the element regions 411-418 along a direction X.

As compared with the first substrate TS3 of FIG. 3A, all the element regions 411-418 of the first substrate TS4 of FIG. 4A are respectively segmented into anode portions A1-A8 and node portions N1-N8 along a direction Y. The anode region A0 and the anode portions A1-A8 are connected in series along the direction X. In other words, the anode region A0 is electrically connected to the anode portions A1-A8. The anode region A0 and the anode portions A1-A8 together form an anode of the first substrate TS4.

As shown in FIG. 4A, areas of the anode portions A1-A8 are in descending order along the direction X. For example, an area of the anode portion A2 is less than an area of the anode portion A1, an area of the anode portion A3 is less than the area of the anode portion A2, and the like. On the other hand, areas of the node portions N1-N8 are in ascending order along the direction X. For example, an area of the node portion N2 is greater than an area of the node portion N1, an area of the node portion N3 is greater than the area of the node portion N2, and the like.

A portion of the second substrate BS4 is segmented into a grounding region 420 and an anode region 422 along the direction Y. Specifically, a left portion of the second substrate BS4 is only provided with the grounding region 420, but the remaining portion is segmented into the grounding region 420 and the anode region 422 along the direction Y.

A width of the anode region 422 in the direction Y is in descending order along the direction X. Using FIG. 4A as an example, a right width y12 is less than a left width y11, so that the anode region 422 substantially assumes a wedge shape. However, a width of a portion of the grounding region 420 in the direction Y is correspondingly in ascending order along the direction X. Using FIG. 4A as an example, a right width y22 is greater than a left width y21.

Figure 4B:
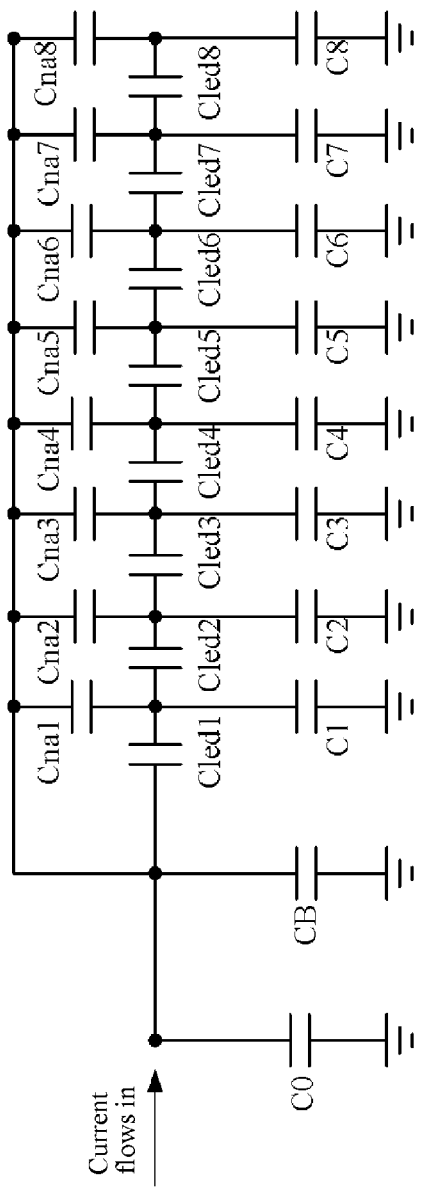
FIG. 4B is an equivalent circuit diagram of the light-bar structure according to FIG. 4A.

Subsequently, refer to FIG. 4A and FIG. 4B at the same time. FIG. 4B is an equivalent circuit diagram of the light-bar structure 400 according to FIG. 4A. A first capacitor C0 is formed between the anode of the first substrate TS4 (the anode region A0 and the anode portions A1-A8) and the grounding region 420. A second capacitor CB is formed between the anode region 422 and a ground terminal (or an iron piece for grounding).

Portions of areas of the node portions N1-N8 correspond to the anode region 422, and therefore, third capacitors Cna1-Cna8 are respectively formed between the node portions N1-N8 and the anode region 422. The width of the anode region 422 in the direction Y is in descending order along the direction X, and therefore, corresponding areas between the anode region 422 and the node portions N1-N8 are in descending order along the direction X. In this case, the capacitors Cna1-Cna8 are in descending order along the direction X. For example, the capacitor Cna2 between the anode region 422 and the node portion N2 is smaller than the capacitor Cna1 between the anode region 422 and the node portion N1, the capacitor Cna3 between the anode region 422 and the node portion N3 is smaller than the capacitor Cna3 between the anode region 422 and the node portion N3, and the like.

Portions of areas of the node portions N1-N8 correspond to the grounding region 420, and therefore, fourth capacitors C1-C8 are respectively formed between the node portions N1-N8 and the grounding region 420. The width of the grounding region 420 in the direction Y is in ascending order along the direction X, and therefore, corresponding areas between the grounding region 420 and the node portions N1-N8 are in ascending order along the direction X. In this case, the capacitors C1-C8 are in ascending order along the direction X. For example, the capacitor C2 between the grounding region 420 and the node portion N2 is larger than the capacitor C1 between the grounding region 420 and the node portion N1, the capacitor C3 between the grounding region 420 and the node portion N3 is larger than the capacitor C2 between the grounding region 420 and the node portion N2, and the like.

In short, capacitances of the capacitors Cna1 to Cna8 are in descending order, and capacitances of the capacitors C1 to C8 are in ascending order.

In some embodiments, all the light-emitting elements are the same, and therefore, capacitors Cled1-Cled8 of the light-emitting elements have a same capacitance. By means of enabling the capacitors Cna1-Cna8 to be in descending order along the direction X and enabling the capacitors C1-C8 to be in ascending order along the direction X, the electricity is averagely allocated to the capacitors Cled1-Cled8, thereby enabling a voltage difference between two ends of each of the capacitors Cled1-Cled8 to be small or to be zero.

The first light-emitting element and the eighth light-emitting element are used as examples for description below. Current flows in from the anode region A0 and sequentially passes the element regions 411-418, and therefore, in a conventional structure, the first light-emitting element (the capacitor Cled1) bears the largest quantity of electricity, and the eighth light-emitting element (the capacitor Cled8) bears the smallest quantity of electricity.

When a capacitance of the capacitor Cna1 is relatively large, the capacitor Cna2 can bypass a relatively large quantity of electricity, so that a relatively small quantity of electricity passes the capacitor Cled1 of the first light-emitting element. On the other hand, a smaller capacitor C1 results in a smaller quantity of electricity passing the capacitor Cled1 of the first light-emitting element. Therefore, by means of an increase in the capacitance of the capacitor Cna1 and a decrease in the capacitance of the capacitor C1, the capacitor Cled1 of the first light-emitting element that originally bears a relatively large quantity of electricity does not need to bear such a large quantity of electricity. Moreover, by means of a decrease in the capacitance of the capacitor Cna8 and an increase in the capacitance of the capacitor C8, the quantity of electricity that the capacitor Cled8 of the eighth light-emitting element bears can be increased, so as to enable the quantity of electricity borne by the capacitor Cled8 of the eighth light-emitting element to be the same as the quantity of electricity borne by the capacitor Cled1 of the first light-emitting element.

Based on the foregoing principle, by means of enabling the capacitors Cna1-Cna8 to be in descending order along the direction X and enabling the capacitors C1-C8 to be in ascending order along the direction X, the electricity is averagely allocated to the capacitors Cled1-Cled8, thereby enabling a voltage difference between two ends of each of the capacitors Cled1-Cled8 to be small or to be zero. At this time, the resistance of the light-bar structure 400 to ESD may achieve the largest.

Figure 5:
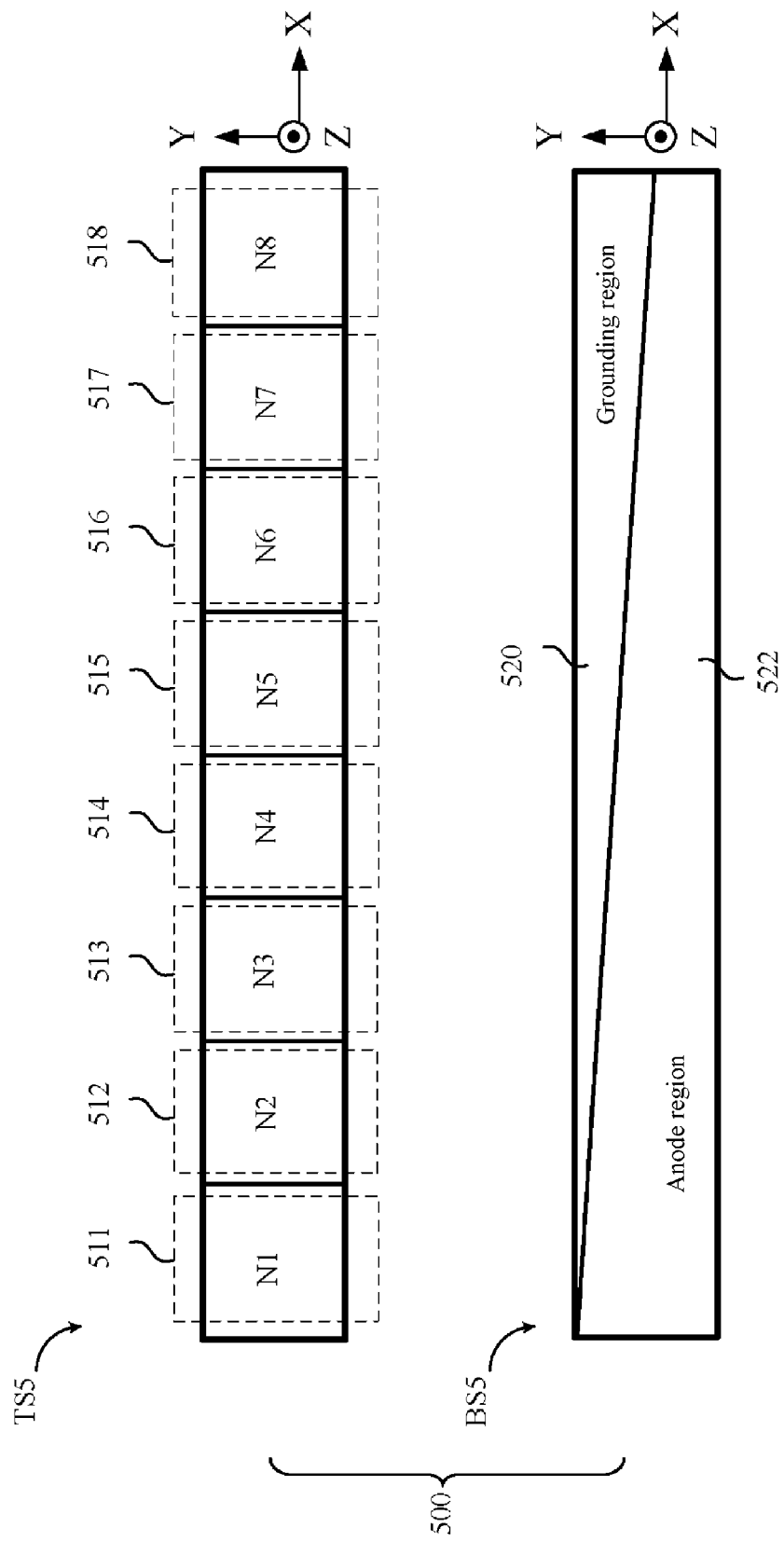
FIG. 5 is a schematic diagram of a light-bar structure according to some embodiments of this disclosure.

FIG. 5 is a schematic diagram of a light-bar structure 500 according to some embodiments of this disclosure. The light-bar structure 500 includes a first substrate TS5, a second substrate BS5, and an insulation layer (not shown).

The first substrate TS5 includes a plurality of element regions 511-518. The element regions 511-518 respectively include node portions N1-N8. The second substrate BS5 includes a grounding region 520 and an anode region 522.

With the configuration of the light-bar structure 500, a width of the grounding region 520 in a direction Y is in ascending order along a direction X, and therefore, corresponding areas between the grounding region 520 and the node portions N1-N8 are in ascending order along the direction X. In this case, capacitors between the grounding region 520 and the node portions N1-N8 are in ascending order along the direction X. In addition, a width of the anode region 522 in the direction Y is in descending order along the direction X. Therefore, corresponding areas between the anode region 522 and the node portions N1-N8 are in descending order along the direction X. In this case, capacitors between the anode region 522 and the node portions N1-N8 are in descending order along the direction X. Similar to the foregoing embodiments, by means of this practice, electricity can be averagely allocated to capacitors of the light-emitting elements.

Figure 6:
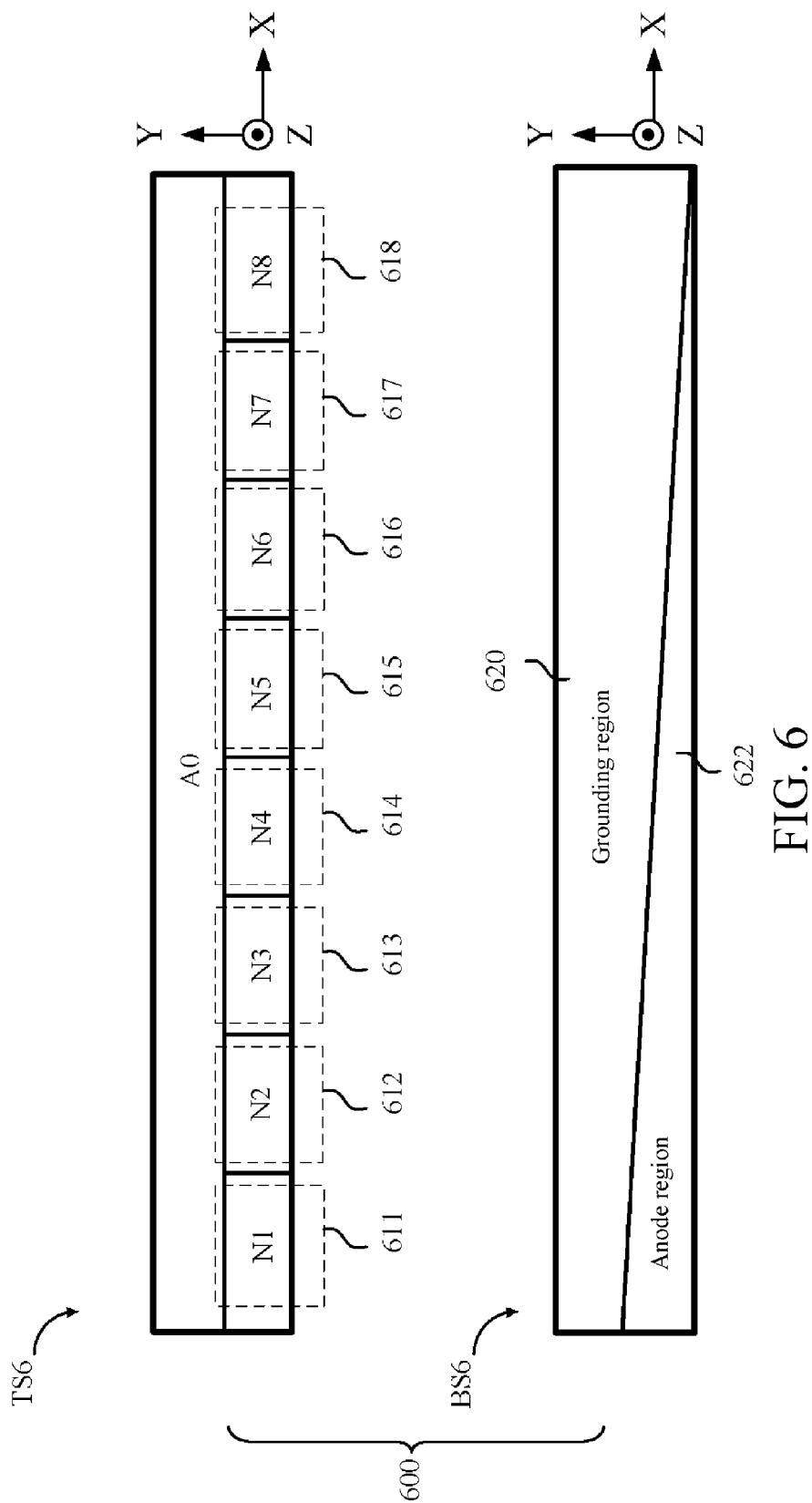
FIG. 6 is a schematic diagram of a light-bar structure according to some embodiments of this disclosure.

FIG. 6 is a schematic diagram of a light-bar structure 600 according to some embodiments of this disclosure. The light-bar structure 600 includes a first substrate TS6, a second substrate BS6, and an insulation layer (not shown).

The first substrate TS6 includes an anode region A0 and a plurality of element regions 611-618. The element regions 611-618 respectively include node portions N1-N8. The second substrate BS6 includes a grounding region 620 and an anode region 622. A portion of the grounding region 620 (for example, an upper half portion of the grounding region 620) corresponds to the anode region A0. The remaining portion of the grounding region 620 (for example, a lower half portion of the grounding region 620) corresponds to the node portions N1-N8. An anode region 622 corresponds to the node portions N1-N8.

With the configuration of the light-bar structure 600, a width of the grounding region 620 in a direction Y is in ascending order along a direction X, and therefore, corresponding areas between the grounding region 620 and the node portions N1-N8 are in ascending order along the direction X. In this case, capacitors between the grounding region 620 and the node portions N1-N8 are in ascending order along the direction X. In addition, a width of the anode region 622 in the direction Y is in descending order along the direction X. Therefore, corresponding areas between the anode region 622 and the node portions N1-N8 are in descending order along the direction X. In this case, capacitors between the anode region 622 and the node portions N1-N8 are in descending order along the direction X. Similar to the foregoing embodiments, by means of this practice, electricity can be averagely allocated to capacitors of light-emitting elements.

Figure 7:
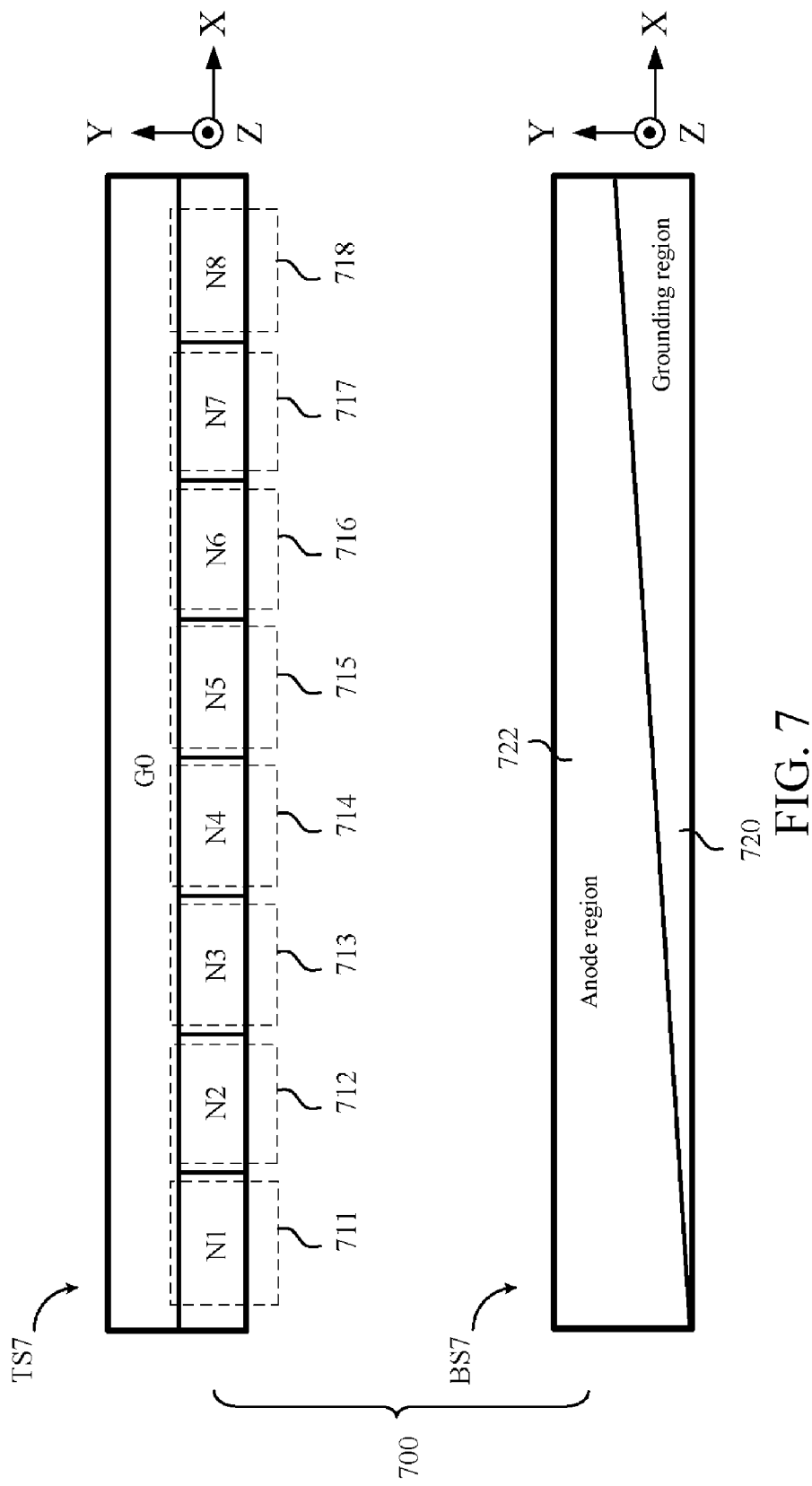
FIG. 7 is a schematic diagram of a light-bar structure according to some embodiments of this disclosure.

FIG. 7 is a schematic diagram of a light-bar structure 700 according to some embodiments of this disclosure. The light-bar structure 700 includes a first substrate TS7, a second substrate BS7, and an insulation layer (not shown).

The first substrate TS7 includes a grounding region G0 and a plurality of element regions 711-718. The element regions 711-718 respectively include node portions N1-N8. The second substrate BS7 includes a grounding region 720 and an anode region 722. A portion of the anode region 722 (for example, an upper half portion of the anode region 722) corresponds to the grounding region G0. The remaining portion of the anode region 722 (for example, a lower half portion of the anode region 722) and the grounding region 720 correspond to the node portions N1-N8.

With the configuration of the light-bar structure 700, a width of the grounding region 720 in a direction Y is in ascending order along a direction X, and therefore, corresponding areas between the grounding region 720 and the node portions N1-N8 are in ascending order along the direction X. In this case, capacitors between the grounding region 720 and the node portions N1-N8 are in ascending order along the direction X. In addition, a width of the anode region 722 in the direction Y is in descending order along the direction X. Therefore, corresponding areas between the anode region 722 and the node portions N1-N8 are in descending order along the direction X. In this case, capacitors between the anode region 722 and the node portions N1-N8 are in descending order along the direction X. Similar to the foregoing embodiments, by means of this practice, electricity can be averagely allocated to capacitors of light-emitting elements.

Figure 8:
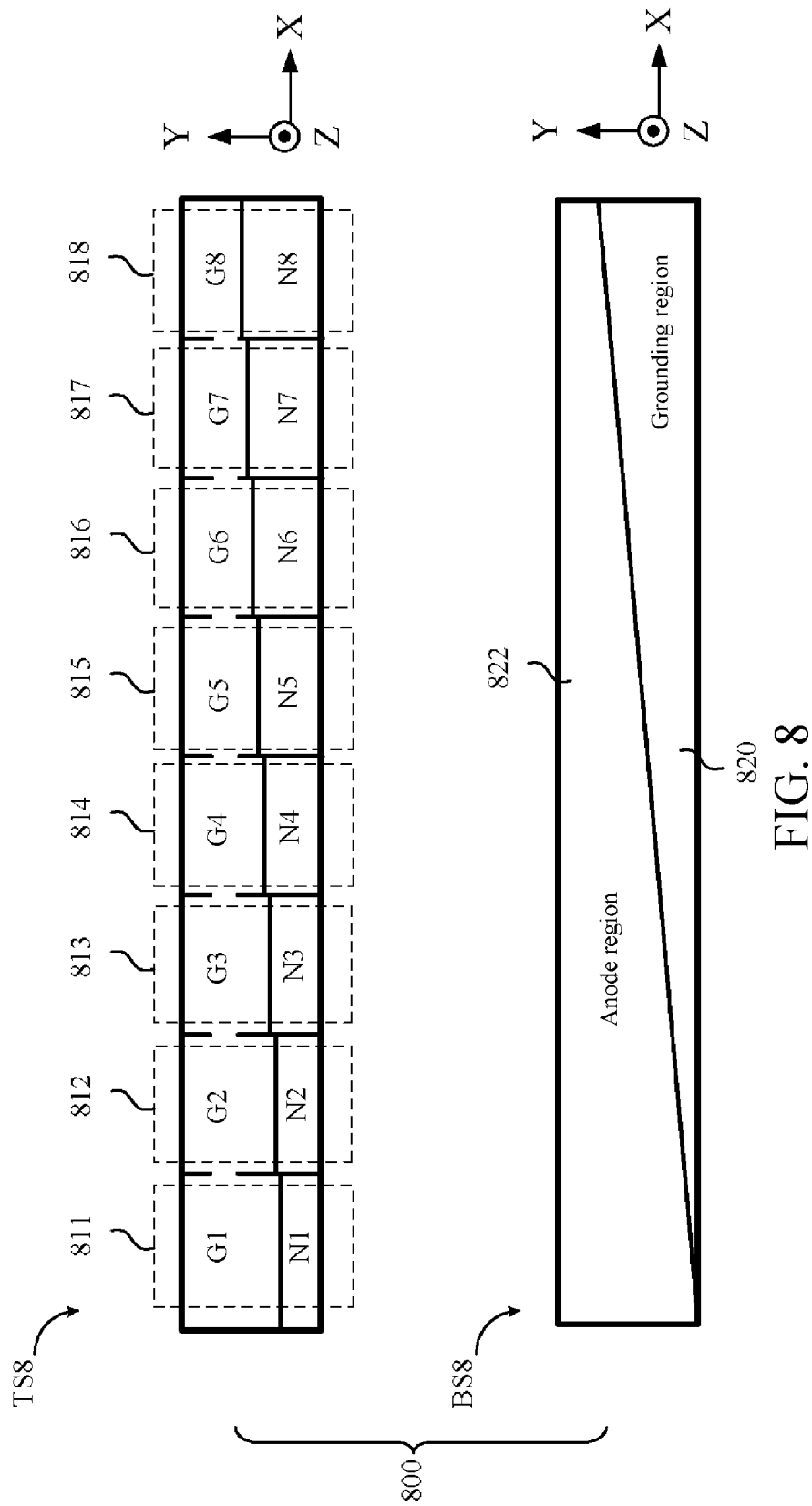
FIG. 8 is a schematic diagram of a light-bar structure according to some embodiments of this disclosure.

FIG. 8 is a schematic diagram of a light-bar structure 800 according to some embodiments of this disclosure. The light-bar structure 800 includes a first substrate TS8, a second substrate BS8, and an insulation layer (not shown).

The first substrate TS8 includes a plurality of element regions 811-818. The element regions 811-818 respectively include grounding portions G1-G8 and node portions N1-N8. The grounding portions G1-G8 are connected in series along a direction X. The second substrate BS8 includes a grounding region 820 and an anode region 822. The grounding portions G1-G8 correspond to the anode region 822. The node portions N1-N8 correspond to the grounding region 820 and a portion of the anode region 822.

With the configuration of the light-bar structure 800, a width of the grounding region 820 in a direction Y is in ascending order along the direction X, and therefore, corresponding areas between the grounding region 820 and the node portions N1-N8 are in ascending order along the direction X. In this case, capacitors between the grounding region 820 and the node portions N1-N8 are in ascending order along the direction X. In addition, a width of the anode region 622 in the direction Y is in descending order along the direction X. Therefore, corresponding areas between the anode region 822 and the node portions N1-N8 are in descending order along the direction X. In this case, capacitors between the anode region 822 and the node portions N1-N8 are in descending order along the direction X. Similar to the foregoing embodiments, by means of this practice, electricity can be averagely allocated to capacitors of light-emitting elements.

Based on the above, by means of application of one of the foregoing embodiments, resistance of a light-bar structure to ESD can be improved.

Although this disclosure is described above by means of the implementation manners, the above description is not intended to limit this disclosure. A person of ordinary skill in the art can make various variations and modifications without departing from the spirit and scope of this disclosure, and therefore, the protection scope of this disclosure is as defined in the appended claims.

What is claimed is:

1. A light-bar structure, comprising:
   a first substrate, comprising a first anode region and a plurality of element regions, wherein a light-emitting element is disposed on a first element region comprising a first anode portion and a node portion, and the first anode region is electrically connected to the anode portion to form an anode of the first substrate;
   a second substrate, comprising a grounding region and a second anode region, wherein a first capacitor is formed between the anode of the first substrate and the grounding region, a second capacitor is formed between the second anode region and a ground terminal, and a third capacitor is formed between the node portion and the second anode region; and
   an insulation layer, disposed between the first substrate and the second substrate.

2. The light-bar structure according to claim 1, wherein the first anode region and the element regions are sequentially disposed along a first direction, each of the element regions comprises the anode portion and the node portion, and the first anode region is electrically connected to the anode portions to form the anode of the first substrate.

3. The light-bar structure according to claim 2, wherein the third capacitors are formed between each node portion and the second anode region, and the charge capacity of the third capacitors are in descending order along the first direction.

4. The light-bar structure according to claim 3, wherein fourth capacitors are formed between each of the node portions and the grounding region, and the charge capacity of the fourth capacitors are in ascending order along the first direction.

* * * * *